(12) United States Patent
Hattori

(10) Patent No.: US 10,202,020 B2
(45) Date of Patent: Feb. 12, 2019

(54) ELECTRIC COMPRESSOR CONTROL SYSTEM AND ELECTRIC COMPRESSOR FOR VEHICULAR AIR CONDITIONING DEVICE PROVIDED WITH SAID SYSTEM

(71) Applicant: MITSUBISHI HEAVY INDUSTRIES THERMAL SYSTEMS, LTD., Minato-ku, Tokyo (JP)

(72) Inventor: Makoto Hattori, Aichi (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 10 days.

(21) Appl. No.: 15/123,451

(22) PCT Filed: Mar. 6, 2015

(86) PCT No.: PCT/JP2015/056614
§ 371 (c)(1),
(2) Date: Sep. 2, 2016

(87) PCT Pub. No.: WO2015/156063
PCT Pub. Date: Oct. 15, 2015

(65) Prior Publication Data
US 2017/0072773 A1  Mar. 16, 2017

(30) Foreign Application Priority Data
Apr. 10, 2014 (JP) .................. 2014-081324

(51) Int. Cl.
*B60H 1/00* (2006.01)
*B60H 1/32* (2006.01)
(Continued)

(52) U.S. Cl.
CPC ......... *B60H 1/3205* (2013.01); *B60H 1/3222* (2013.01); *F04B 35/04* (2013.01);
(Continued)

(58) Field of Classification Search
None
See application file for complete search history.

(56) References Cited

U.S. PATENT DOCUMENTS

| 6,134,126 A | 10/2000 | Ikekame et al. |
| 2008/0087458 A1 | 4/2008 | Hattori et al. |

(Continued)

FOREIGN PATENT DOCUMENTS

| CN | 2682735 Y | 3/2005 |
| CN | 101162855 A | 4/2008 |

(Continued)

OTHER PUBLICATIONS

Office Action dated Jun. 28, 2017 for corresponding Chinese Patent Application No. 201580012585.1 with an English Translation.

*Primary Examiner* — Rami Khatib
(74) *Attorney, Agent, or Firm* — Birch, Stewart, Kolasch & Birch, LLP

(57) ABSTRACT

The present invention suppresses electromagnetic noise generated from a substrate on which a microcomputer and the like are mounted. An electric compressor control system has regions divided by a plurality of ground patterns formed on a substrate. On the substrate, a vehicle information obtaining line is formed so as to traverse the regions divided by the plurality of ground patterns, and the vehicle information obtaining line is connected to a microcomputer provided on the substrate. On the vehicle information obtaining line, a coil is provided at a location that traverses the region and the region divided by the different ground patterns. The coil reduces noise generated from the vehicle information obtaining line.

4 Claims, 3 Drawing Sheets

(51) Int. Cl.
*H05K 1/02* (2006.01)
*F04B 35/04* (2006.01)
*F04B 39/00* (2006.01)
*F04B 49/06* (2006.01)

(52) U.S. Cl.
CPC ............ *F04B 39/00* (2013.01); *F04B 49/065* (2013.01); *H05K 1/0227* (2013.01); *B60H 2001/006* (2013.01); *B60H 2001/327* (2013.01); *B60H 2001/3292* (2013.01); *H05K 1/0233* (2013.01); *H05K 2201/1003* (2013.01)

(56) References Cited

U.S. PATENT DOCUMENTS

| | | | |
|---|---|---|---|
| 2010/0181876 A1* | 7/2010 | Watanabe | F04B 35/04 310/68 D |
| 2010/0223947 A1 | 9/2010 | Shibuya | |
| 2010/0244753 A1* | 9/2010 | Boudjemai | B60L 7/003 318/381 |
| 2012/0112588 A1* | 5/2012 | Watanabe | H02K 1/276 310/90 |
| 2013/0293047 A1 | 11/2013 | Nagasaka et al. | |

FOREIGN PATENT DOCUMENTS

| | | |
|---|---|---|
| CN | 101375057 A | 2/2009 |
| CN | 103311431 A | 9/2013 |
| JP | 2011-77581 A | 4/2011 |
| JP | 2012-172611 A | 9/2012 |
| WO | WO 2007/086270 A1 | 8/2007 |

* cited by examiner

ELECTRIC COMPRESSOR CONTROL SYSTEM AND ELECTRIC COMPRESSOR FOR VEHICULAR AIR CONDITIONING DEVICE PROVIDED WITH SAID SYSTEM

TECHNICAL FIELD

The present invention relates to an electric compressor control system configured to control an electric compressor and an electric compressor for a vehicular air conditioning device provided with the electric compressor control system.

BACKGROUND ART

Operations of an electric motor configured to drive an electric compressor, which forms a vehicular air conditioning device, are controlled by an electric compressor control system that includes a microcomputer. For example, the electric compressor control system performs control for converting a direct current voltage, which is supplied from a high voltage power supply to drive the electric motor, to an alternating current voltage. In addition, the electric compressor control system performs communication of control signals with an engine control unit (ECU) to control the vehicular air conditioning device, via a communication line.

A vehicular electric system, including the microcomputer and the like of the electric compressor control system, is operated using power supplied from an on-vehicle battery. The voltage supplied from the on-vehicle battery and the voltage of the high voltage power supply for driving the electric motor are significantly different from each other. If the high voltage for driving the electric motor is applied to other electric systems, such as the on-vehicle battery system, this results in failure of the system. Thus, a high voltage system, which is the high voltage power supply system, and a low voltage system, which is the on-vehicle battery system, are insulated from each other.

Here, since the high voltage system is used for driving the electric motor, the voltage and the current thereof fluctuate significantly. This results in a problem in which the high voltage system becomes a source of noise generation in a control circuit.

Thus, in order to reduce a noise current in the control circuit, Patent Document 1 describes a system in which impedances each having the same capacity are inserted between and connected to a frame grounded housing and PN lines configured to allow power to be supplied from a high voltage power supply to an inverter.

CITATION LIST

Patent Documents

Patent Document 1: Japanese Unexamined Patent Application Publication No. 2012-172611A

SUMMARY OF INVENTION

Technical Problem

Wiring connected to a microcomputer is generally connected to a same ground pattern formed on a substrate, up to where the wiring reaches the microcomputer. Thus, when a plurality of wires (power supply lines, communication lines, and the like) are arranged on the substrate in a complex manner, noise is easily generated, and this has been a source of FM-band noise, for example.

In light of the foregoing, an object of the present invention is to provide an electric compressor control system capable of suppressing electromagnetic noise generated from a substrate, on which a microcomputer and the like are mounted, and an electric compressor for a vehicular air conditioning device provided with the electric compressor control system.

Solution to Problem

A first aspect of the present invention is an electric compressor control system provided with a microcomputer configured to control an electric motor configured to drive an electric compressor forming a vehicular air conditioning device. The electric compressor control system includes: a plurality of ground patterns formed on a substrate; regions divided by the ground patterns formed on the substrate; a wiring pattern formed on the substrate so as to traverse the regions divided by the plurality of ground patterns, and connected to the microcomputer; and an inductive component provided at a location, in the wiring pattern, that traverses the regions divided by the different ground patterns.

According to this aspect, the plurality of ground patterns are formed on the same substrate. In this way, by providing the plurality of ground patterns, a pathway on which noise is generated can be shortened, and generation of the noise can thus be suppressed. In addition, on the substrate, the wiring pattern connected to the microcomputer is formed so as to traverse the regions divided by the plurality of ground patterns. Further, the inductive component is provided at the location, in the wiring pattern, that traverses the regions divided by the different ground patterns. As a result, noise generated from the wiring pattern can be reduced. Typical examples of the above-described inductive component include a coil.

In the above-described electric compressor control system, the wiring pattern is a vehicle information obtaining line configured to obtain information from a vehicle, for example.

As a result, the microcomputer can obtain the information from the vehicle via the vehicle information obtaining line.

A second aspect of the present invention is an electric compressor for a vehicular air conditioning device provided with the above-described electric compressor control system.

According to this aspect, since the electric compressor control system is provided that is capable of reducing electromagnetic noise generated from the interior of the substrate, such as from the microcomputer, an impact arising from the electromagnetic noise affecting other devices on the vehicle can be reduced.

Advantageous Effects of Invention

The present invention achieves an effect by which electromagnetic noise generated from a substrate, on which a microcomputer and the like are mounted, can be suppressed.

BRIEF DESCRIPTION OF DRAWINGS

FIG. 1A illustrates an outline configuration of ground patterns of the substrate, and FIG. 1B illustrates an outline configuration of regions divided by the ground patterns of the substrate.

FIG. 2A illustrates an outline configuration of ground patterns of the substrate, and FIG. 2B illustrates an outline configuration of regions divided by the ground patterns of the substrate.

DESCRIPTION OF EMBODIMENT

An embodiment of an electric compressor control system according to the present invention and of an electric compressor for a vehicular air conditioning device provided with the electric compressor control system will be described below with reference to the drawings.

Figure 1A:
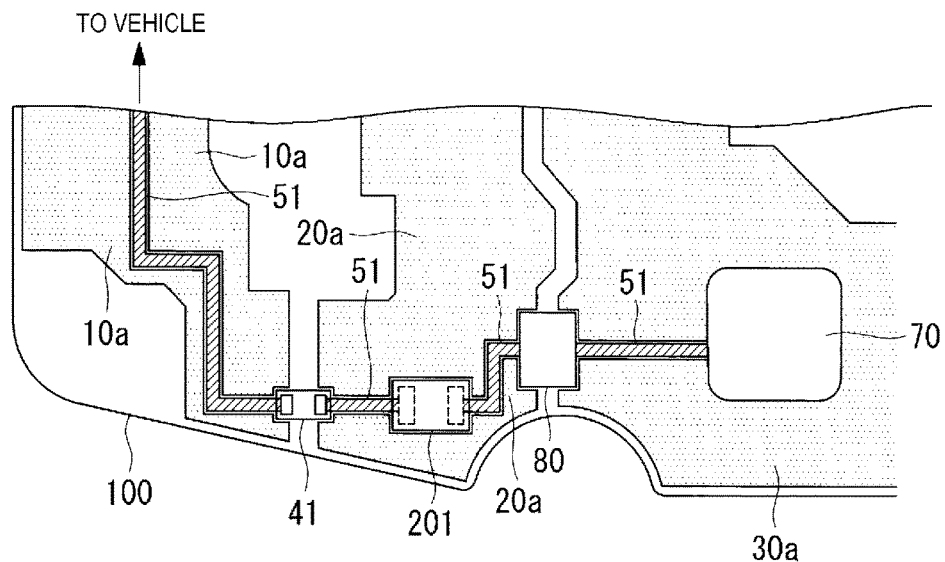
FIGS. 1A and 1B are diagrams schematically illustrating a partial configuration of a surface of a substrate in an electric compressor control system according to an embodiment of the present invention, where
Figure 1B:
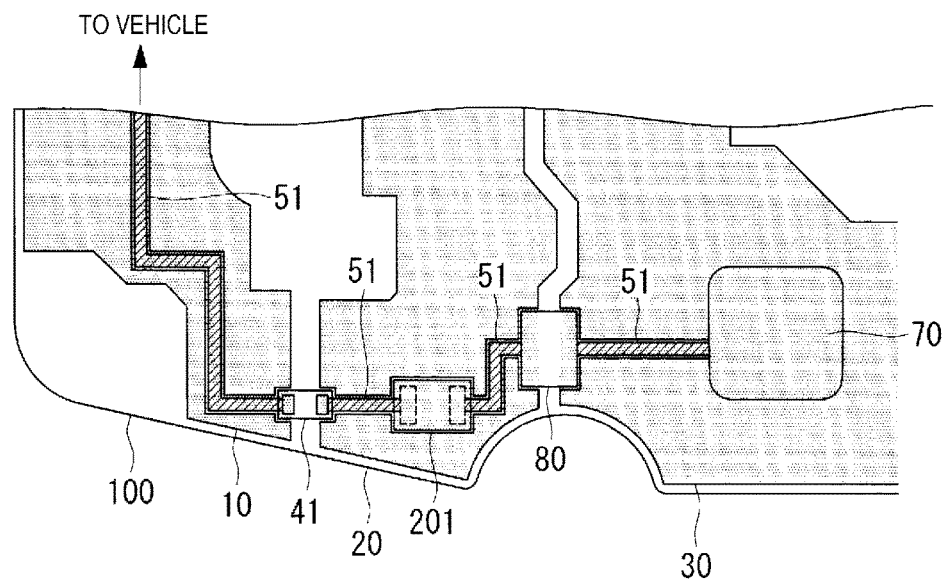
Figure 2A:
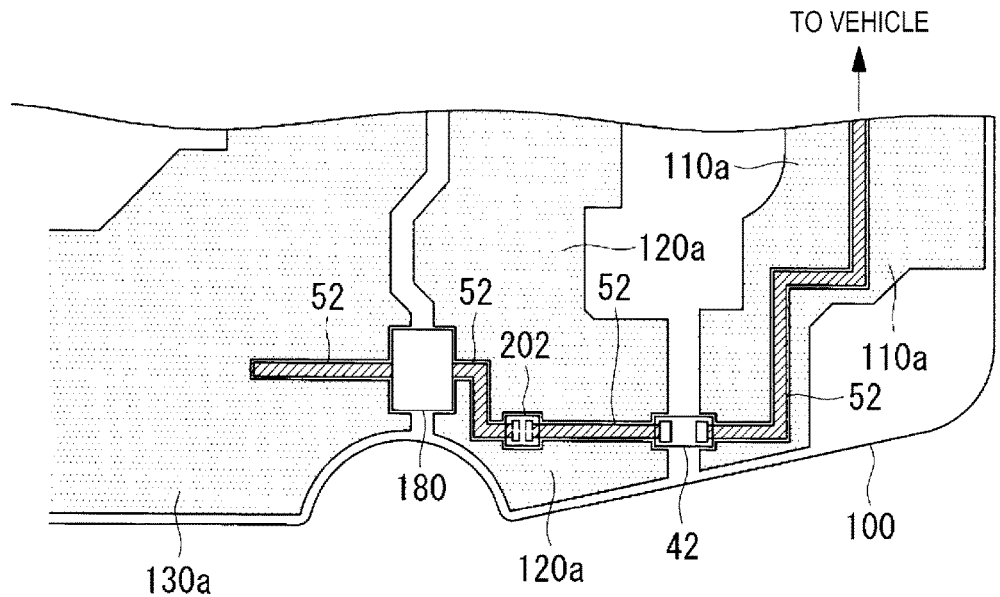
FIGS. 2A and 2B are diagrams schematically illustrating a partial configuration of a back surface of the substrate in the electric compressor control system according to the embodiment of the present invention, where
Figure 2B:
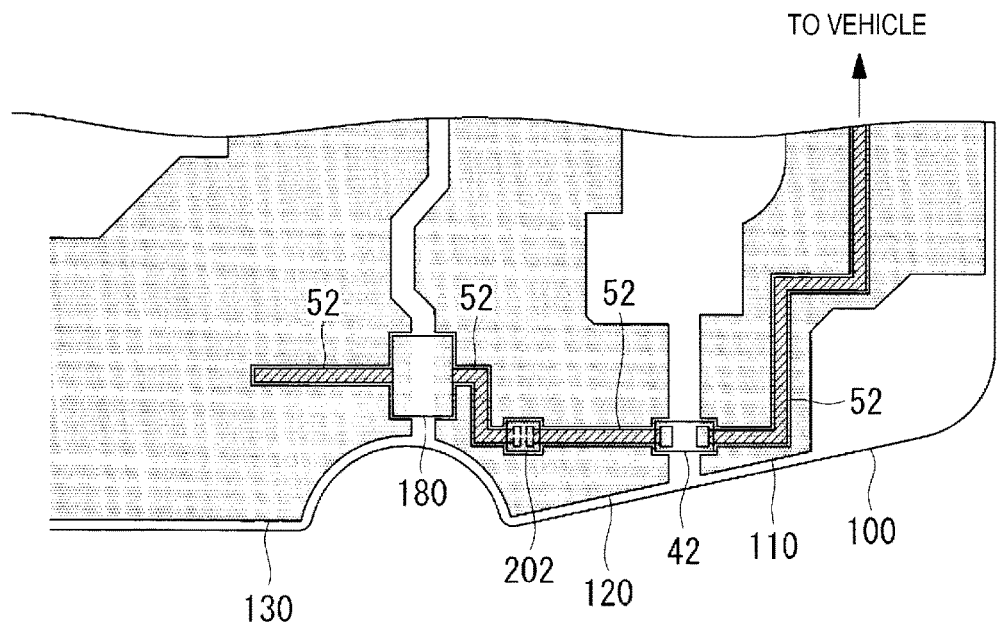
Figure 3:
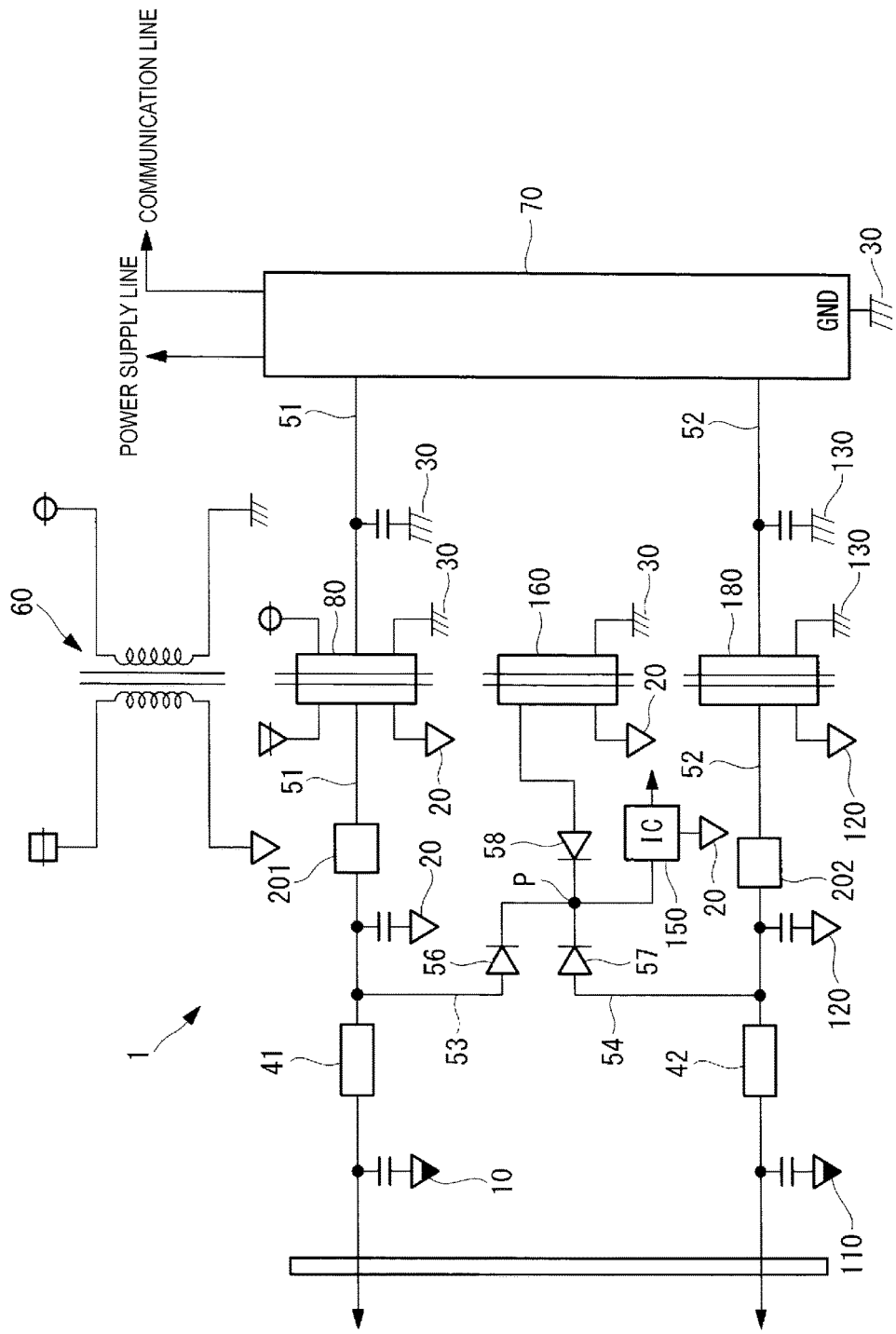
FIG. 3 is a circuit diagram schematically illustrating a configuration of a vehicle information obtaining line in the electric compressor control system according to the embodiment of the present invention.

FIGS. 1A, 1B, 2A and 2B are diagrams each schematically illustrating a partial configuration of a substrate 100 in an electric compressor control system 1 according to the present embodiment, where FIGS. 1A and 1B illustrate an outline configuration of a surface of the substrate 100, and FIGS. 2A and 2B illustrate an outline configuration of a back surface of the substrate 100. Note that details, such as wiring patterns formed on the substrate 100 and land arrangements of mounted components, are omitted in the drawings. FIG. 3 is a circuit diagram schematically illustrating a configuration of a vehicle information obtaining line of the electric compressor control system 1 according to the present embodiment.

Further, in the present embodiment, the substrate 100 is a multilayer substrate. For example, when it is assumed that the substrate 100 is an n-layer substrate, FIGS. 1A and 1B illustrate a first layer of the substrate 100, and FIGS. 2A and 2B illustrate an n-th layer of the substrate 100. Inner layers are also provided with ground patterns and the like, and those ground patterns and the like are connected to ground patterns of the surface (the first layer) and the back surface (the n-th layer).

As illustrated in FIGS. 1A and 1B, on the surface of the substrate 100, regions 10, 20 and 30 divided by a plurality of ground patterns are formed, and as illustrated in FIGS. 2A and 2B, on the back surface of the substrate 100, regions 110, 120, and 130 divided by a plurality of ground patterns are formed. The regions 10, 20, 30, 110, 120, and 130 divided by those ground patterns are respectively formed by ground patterns 10a, 20a, 30a, 110a, 120a, and 130a, circuit configuration patterns and components, and the like. In some cases, each of the ground patterns 10a, 20a, 30a, 110a, 120a, and 130a may be shared among constituent elements mounted on the substrate 100 as appropriate.

The ground patterns 10a, 20a, 30a, 110a, 120a, and 130a are regions formed by projecting the regions 10, 20, 30, 110, 120, and 130, which are divided by the ground patterns illustrated in FIG. 1B and FIG. 2B, onto the surface (the first layer) and the back surface (the n-th layer) of the substrate 100, from a direction perpendicular to each of the surface and the back surface of the substrate 100. Specifically, the regions divided by the ground patterns are regions including the ground patterns, signal lines, components, and the like. For example, the region 10 divided by the ground patterns includes the ground pattern 10a and a vehicle information obtaining line 51.

Further, the ground patterns 10a, 20a, 30a, 110a, 120a, and 130a are each formed independently on the substrate 100. Some of the ground patterns may be grounded by being attached to a chassis or the like by screws and the like.

As illustrated in FIGS. 1A and 1B, on the surface of the substrate 100, a microcomputer 70 is mounted, and also, the vehicle information obtaining line 51 is formed that obtains information from an engine control unit (ECU) that controls a vehicle. In the same manner, as illustrated in FIGS. 2A and 2B, on the back surface of the substrate 100, a vehicle information obtaining line 52 is formed that obtains the information from the ECU that controls the vehicle. Examples of the vehicle information (information from the vehicle) include information causing power inside an inverter to be switched ON or OFF. The present embodiment is described while assuming that each of the vehicle information obtaining lines 51 and 52 transfers the same vehicle information.

The microcomputer 70 controls an electric motor configured to drive an electric compressor forming a vehicular air conditioning device (not illustrated).

The above-described vehicle information obtaining lines 51 and 52, a power supply line, and various communication lines are connected to the microcomputer 70. Since the power supply line and the plurality of communication lines are also formed as patterns on the substrate 100, wiring patterns on the substrate 100 become complex. The microcomputer 70 controls the electric motor on the basis of information transferred via the communication lines (each piece of sensor information required to drive the electric motor, for example) and the information transferred via the vehicle information obtaining lines 51 and 52. For example, the microcomputer 70 controls the electric motor such that the electric motor is rotated at a desired rotational frequency by sending a predetermined control command to an inverter or the like that forms a drive circuit of the electric motor.

As illustrated in FIGS. 1A and 1B, the vehicle information obtaining line 51 is formed on the substrate 100 so as to traverse the regions divided by the plurality of ground patterns, such as the regions 10 and 20 divided by the ground patterns. Further, as illustrated in FIGS. 2A and 2B, the vehicle information obtaining line 52 is formed so as to traverse the regions 110 and 120 divided by the ground patterns. Then, coils (inductive components) 41 and 42 are provided on the vehicle information obtaining lines 51 and 52, at locations traversing the regions divided by the different ground patterns. In this way, by connecting the coils 41 and 42 at the locations traversing the regions divided by the different ground patterns, noise generated from the substrate 100 can be reduced. Specifically, as described above, although a plurality of wires are formed on the substrate 100 in a complex manner, as a result of arranging the coils 41 and 42 at the above-described locations, noise generated from the vehicle information obtaining lines 51 and 52 can be reduced. With respect to each of the coils 41 and 42, by conducting tests in advance, a coil having inductance of an appropriate numerical value range is used in accordance with the frequency band of the noise to be reduced.

As illustrated in FIG. 3, an isolator 80, such as a photo coupler, is provided on the vehicle information obtaining line 51. A signal from the vehicle side is transferred to the microcomputer 70 via the isolator 80. In the same manner, an isolator 180 is provided on the vehicle information obtaining line 52. The signal from the vehicle side is transferred to the microcomputer 70 via the isolator 180. As a power supply for primary-side circuits of the isolators 80 and 180, a predetermined voltage (5V, for example) is supplied that is generated by a three-terminal regulator (not illustrated) from a vehicle power supply (12V, for example).

Further, as a power supply for a secondary-side circuit of the isolator 80, a secondary-side voltage (5V, for example) is supplied that is generated by a transformer 60 that uses the vehicle power supply as a primary-side input voltage thereof.

On the vehicle information obtaining lines 51 and 52, branch wires 53 and 54 are connected at locations between the coils 41 and 42 and the primary-side circuits of the isolators 80 and 180. The branch wires 53 and 54 are connected to each other at a connection point P, via diodes 56 and 57 disposed in the forward direction, respectively, and then connected to a predetermined input terminal of an IC chip 150. As a result, a configuration is obtained in which signals that are transferred via the vehicle information obtaining lines 51 and 52 are also transferred to the IC chip 150. The connection point P of the branch wires 53 and 54 is connected to a primary side of an isolator 160, which is provided separately from the above-described isolators 80 and 180, via a diode 58. The diode 58 is connected in a reverse direction to that of the diodes 56 and 57.

Further, on the vehicle information obtaining line 51, a component group 201 is provided at a location between the coil 41 and the primary-side circuit of the isolator 80, and on the vehicle information obtaining line 52, a component group 202 is provided at a location between the coil 42 and the primary-side circuit of the isolator 180. For example, transistors, capacitors, resistances, and the like are installed as the component groups 201 and 202. Although many circuit components, such as the component groups 201 and 202, are generally connected to the vehicle information obtaining lines 51 and 52, components other than the component groups 201 and 202 are omitted in the drawings.

For the vehicle information obtaining line 51, the ground patterns 10a and 20a (see FIG. 1A) are used as a ground on the primary side of the isolator 80, and the ground pattern 30a (see FIG. 1A) is used as a ground on the secondary side of the isolator 80.

For the vehicle information obtaining line 52, the ground patterns 110a and 120a (see FIG. 2A) are used as a ground on the primary side of the isolator 180, and the ground pattern 130a (see FIG. 2A) is used as a ground on the secondary side of the isolator 180. The same applies to the transformer 60, the three-terminal regulator, or the like, for example. When the transformer 60, the three-terminal regulator or the like is provided on the surface of the substrate 100, the ground patterns 10a and 20a are used as the ground of the primary-side circuit, and the ground pattern 30a is used as the ground of the secondary-side circuit. Further, when the transformer 60, the three-terminal regulator or the like is provided on the back surface of the substrate 100, the ground patterns 110a and 120a are used as the ground of the primary-side circuit, and the ground pattern 130a is used as the ground of the secondary-side circuit. Note that FIG. 3 illustrates a case in which both the transformer 60 and the isolator 160 are provided on the surface of the substrate 100.

Whether to use the ground pattern 10a or 20a and whether to use the ground pattern 110a or 120a is determined in accordance with positional relationships between the wiring patterns and the ground patterns on the substrate 100. Specifically, the ground pattern closest to the wiring pattern is used as the ground thereof.

As described above, according to the electric compressor control system and the electric compressor for the vehicular air conditioning device provided with the electric compressor control system, in contrast to a general configuration in which a single ground pattern is formed on a substrate, the plurality of ground patterns 10a, 20a, 30a, 110a, 120a, and 130a are formed on the same substrate 100. In this way, by dividing the ground patterns and providing the plurality of ground patterns, the transferral of noise can be inhibited. As a result, the noise generated from the substrate can be suppressed.

Further, when the wiring patterns connected to the microcomputer 70 (the vehicle information obtaining lines 51 and 52, for example) are formed so as to traverse the regions divided by the plurality of ground patterns, the coils 41 and 42, which are inductive components, are provided, with respect to the wiring patterns, at the locations traversing the regions divided by the different ground patterns. As a result, the noise generated from the wiring can be reduced.

Further, since the microcomputer 70 is connected to each of the vehicle information obtaining lines 51 and 52, which are wires configured to obtain the vehicle information, the microcomputer 70 can obtain the vehicle information (information that causes the power inside the inverter to be switched ON or OFF, for example) via the vehicle information obtaining lines 51 and 52.

The embodiment of the present invention has been described above in detail with reference to the drawings, but the specific configurations are not limited to the embodiment, and design changes and the like that do not depart from the scope of the present invention are also included.

For example, descriptions have been made above while using an example in which the vehicle information obtaining lines 51 and 52 are used as the wiring patterns on which the coils are provided, but a coil may be arranged in a portion of another wiring pattern at a location that traverses different ground patterns.

Further, an example has been described above in which the vehicle information obtaining lines 51 and 52 are formed on the surface and the back surface of the substrate 100, respectively, but the vehicle information obtaining lines 51 and 52 may be formed on only one of the surface or the back surface of the substrate 100. Further, although the microcomputer 70 is provided on the surface of the substrate 100, the number of microcomputers provided thereon is also not limited to any particular number.

Furthermore, the number of the regions divided by the ground patterns formed on the substrate 100 is also not limited to any particular number, and it is sufficient that at least two regions are provided, for example. In this case, it is preferable that the coil be provided at each location at which the wiring pattern traverses the regions divided by the different ground patterns.

REFERENCE SIGNS LIST

1 Electric compressor control system
10, 20, 30, 110, 120, 130 Region divided by ground patterns
10a, 20a, 30a, 110a, 120a, 130a Ground pattern
41, 42 Coil (inductive component)
51, 52 Vehicle information obtaining line
60 Transformer
70 Microcomputer

The invention claimed is:
1. An electric compressor control system provided with a microcomputer configured to control an electric motor configured to drive an electric compressor forming a vehicular air conditioning device, the electric compressor control system comprising:
  a plurality of different ground patterns formed on a surface and a back surface of a substrate and each provided independently on the substrate;

a plurality of different regions divided by the ground patterns formed on the surface and the back surface of the substrate;

a plurality of wiring patterns each formed on the surface and the back surface of the substrate so as to traverse the plurality of regions divided by the ground patterns, and connected to the microcomputer; and an inductive component provided at a location, in the wiring patterns each formed on the surface and the back surface of the substrate, that traverses the plurality of regions divided by the ground patterns.

2. The electric compressor control system according to claim 1, wherein the wiring pattern is a vehicle information obtaining line configured to obtain information from a vehicle.

3. An electric compressor for a vehicular air conditioning device comprising: the electric compressor control system described in claim 2.

4. An electric compressor for a vehicular air conditioning device comprising: the electric compressor control system described in claim 1.

\* \* \* \* \*